United States Patent [19]

Masenas

[11] Patent Number: 5,903,230

[45] Date of Patent: May 11, 1999

[54] APPARATUS FOR COMPRESSING DATA USING A LEMPEL-ZIV-TYPE ALGORITHM

[75] Inventor: Charles J. Masenas, Essex Junction, Vt.

[73] Assignee: International Business Machines Corp., Armonk, N.Y.

[21] Appl. No.: 08/899,205

[22] Filed: Jul. 23, 1997

Related U.S. Application Data

[63] Continuation of application No. 08/408,577, Mar. 22, 1995, Pat. No. 5,771,010.

[51] Int. Cl.$^6$ ..................................................... H03M 7/00
[52] U.S. Cl. ................................................................ 341/51
[58] Field of Search ............................... 341/51, 106, 107

[56] References Cited

U.S. PATENT DOCUMENTS

| | | | |
|---|---|---|---|
| 5,003,307 | 3/1991 | Whiting et al. | 341/51 |
| 5,140,321 | 8/1992 | Jung | 341/55 |
| 5,150,430 | 9/1992 | Chu | 382/56 |
| 5,281,967 | 1/1994 | Jung | 341/55 |
| 5,525,982 | 6/1996 | Cheng et al. | 341/51 |
| 5,572,209 | 11/1996 | Farmer et al. | 341/67 |
| 5,612,693 | 3/1997 | Craft et al. | 341/51 |
| 5,652,878 | 7/1997 | Craft | 395/601 |
| 5,710,562 | 1/1998 | Gormish et al. | 341/107 |

*Primary Examiner*—Howard L. Williams
*Attorney, Agent, or Firm*—Sughrue, Mion, Zinn, Macpeak & Seas, PLLC

[57] ABSTRACT

A data processing system having a compression and decompression apparatus based on the Lempel-Ziv algorithm. The compression apparatus includes an array section having a circular history CAM unit for receiving and storing one or more data elements and a coding unit for determining whether received data elements previously have been stored in the history CAM unit and are a candidate for compression. If a received data element matches at least one of the stored data elements, a PS logic section determines whether there is the presence of a string. An encoding section identifies the address of the matching stored data element in a string and the length of the string. The compression apparatus generates a compression token comprising an identification of whether a data element is compressed, the length of the coded data within a plurality of predetermined data length categories and an address. The compression apparatus uses a particular hardware implementation of the PS logic section.

11 Claims, 15 Drawing Sheets

FIG. 1A PRIOR ART

| Case | Code | Code Length (2K RAM) | Description |
|------|------|----------------------|-------------|
| 1.) | 0bbbbbbb | 9 | Raw Byte |
| 2.) | 10Ldddddddd | 14 | Length = 2 - 3 |
| 3.) | 110LLdddddddd | 16 | Length = 4 - 7 |
| 4.) | 1110LLLdddddddd | 18 | Length = 8 - 15 |
| | | | (LLL = 000, 001, ..., 111) |
| 5.) | 11110LLLLdddddddd | 20 | Length = 16 - 31 |
| | | | (LLLL = 0000, 0001, ..., 1111) |
| 6.) | 11111LLLLLLLLdddddddd | 24 | Length = 32 - 271 |
| | | | (LLLLLLLL = 00000000 - 11101111) |

FIG. 1B PRIOR ART

| code data | description |
|---|---|
| "0bbbbbbb" | - 0 plus ASCII code for "t" |
| "0bbbbbbb" | - 0 plus ASCII code for "h" |
| "0bbbbbbb" | - 0 plus ASCII code for "e" |
| "0bbbbbbb" | - 0 plus ASCII code for " " |
| "0bbbbbbb" | - 0 plus ASCII code for "b" |
| "0bbbbbbb" | - 0 plus ASCII code for "o" |
| "0bbbbbbb" | - 0 plus ASCII code for "y" |
| "0bbbbbbb" | - 0 plus ASCII code for " " |
| "110LLddddddd" | - length=04, displacement=0 (note 1) |
| "0bbbbbbb" | - 0 plus ASCII code for "d" |
| "0bbbbbbb" | - 0 plus ASCII code for "o" |
| "0bbbbbbb" | - 0 plus ASCII code for "g" | note 1 - LL=00, ddddddd=0000000 here to code length=4, d=0. So the actual compressed code is "1100000000000000"

FIG. 1C PRIOR ART

| word # | 16-bit words |
|---|---|
| 1 | 0bbbbbbb0bbbbbbb |
| 2 | bb0bbbbbbbb0bbbb |
| 3 | bbbb0bbbbbbbb0bb |
| 4 | bbbbbb0bbbbbbbb0 |
| 5 | bbbbbbbb1101ldd |
| 6 | ddddddd0bbbbbbb |
| 7 | b0bbbbbbbb0bbbbb |
| 8 | bbb | bit 0 ← → bit 15

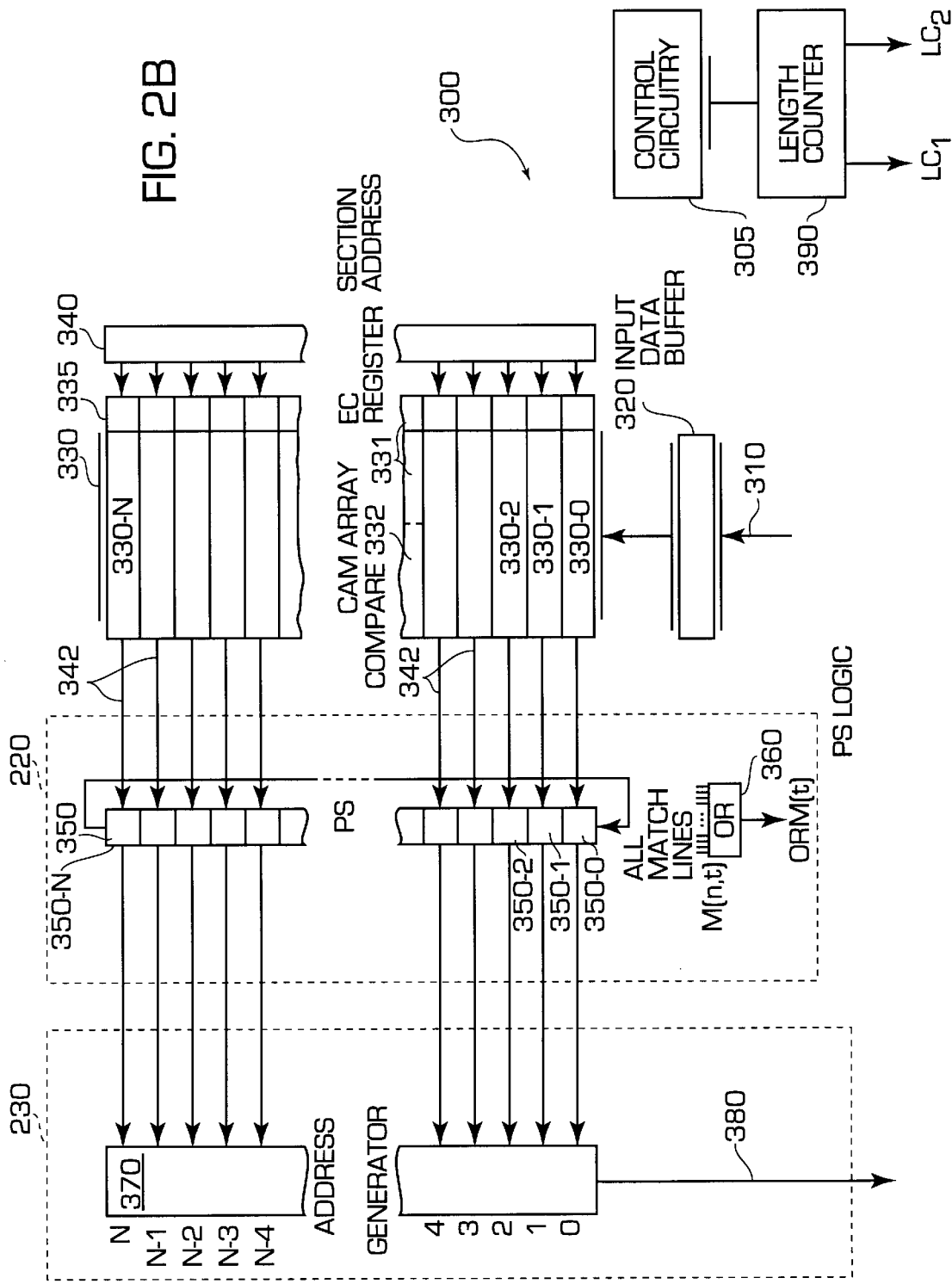

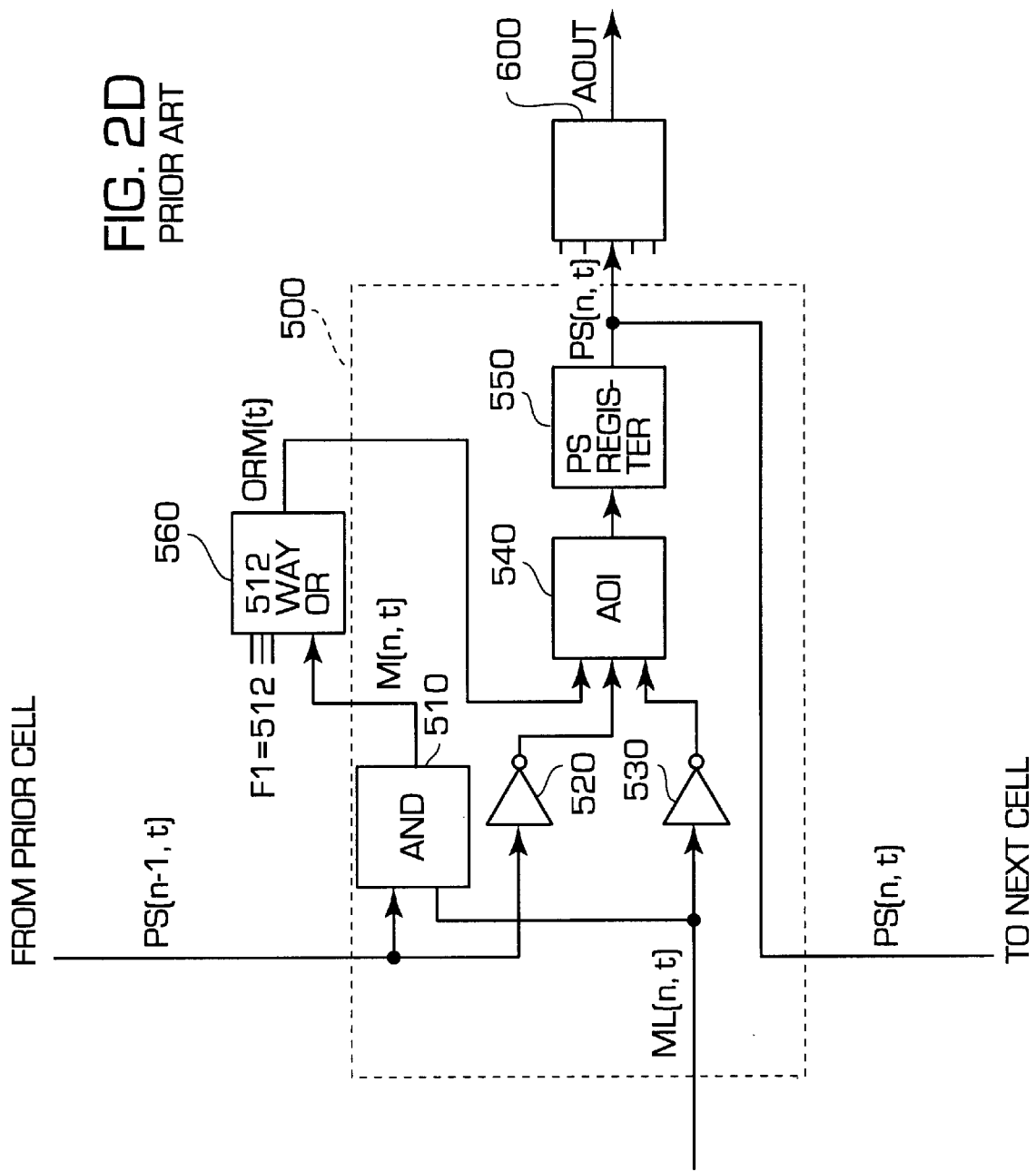

FIG. 4A PRIOR ART

| | [t] | [t+1] | [t+2] | [t+3] | [t+4] | [t+5] | [t+6] |
|---|---|---|---|---|---|---|---|
| DATA0 | \<byte 0\> | | \<byte 2\> | | \<byte 4\> | | \<byte 6\> |
| DATA1 | \<byte 1\> | | \<byte 3\> | | \<byte 5\> | | \<byte 7\> |
| CAM BUFFER | | \<byte 0\> | \<byte 1\> | \<byte 2\> | \<byte 3\> | \<byte 4\> | \<byte 5\> |
| MATCH LATCHES | | | \<byte 0\> | \<byte 1\> | \<byte 2\> | \<byte 3\> | \<byte 4\> |
| PRIMARY SHIFT REGISTER | | | | \<byte 0\> | \<byte 1\> | \<byte 2\> | \<byte 3\> |
| CAM PRIORITY LATCHES | | | | | \<byte 0\> | \<byte 1\> | \<byte 2\> |
| BINARY LENGTH COUNT $LC_1$ | | | | | | \<byte 0\> | \<byte 1\> |
| ARRAY PRIORITY LATCHES | | | | | | \<byte 0\> | \<byte 1\> |
| ENCODED LENGTH COUNT $LC_2$ | | | | | | \<byte 0\> | \<byte 1\> |
| OFFSET | | | | | | | \<byte 0\> |

FIG. 4B PRIOR ART

| | (t+3) | (t+4) | (t+5) | (t+6) | (t+7) | (t+8) | (t+9) |
|---|---|---|---|---|---|---|---|
| DATA0 | | <byte 4> | | <byte 6> | | <byte 8> | |
| DATA1 | | <byte 5> | | <byte 7> | | <byte 9> | |
| CAM BUFFER | <byte 2> | <byte 3> | <byte 4> | <byte 5> | <byte 6> | <byte 7> | <byte 8> |
| MATCH LATCHES | <byte 1> | <byte 2> | <byte 3> | <byte 4> | <byte 5> | <byte 6> | <byte 7> |
| PRIMARY SHIFT REGISTER | <byte 0> | <byte 1> | <byte 2> | <byte 3> | <byte 4> | <byte 5> | <byte 6> |
| CAM PRIORITY LATCHES | | <byte 0> | <byte 1> | <byte 2> | <byte 3> | <byte 4> | <byte 5> |
| ARRAY PRIORITY LATCHES | | | <byte 0> | <byte 1> | <byte 2> | <byte 3> | <byte 4> |
| BINARY LENGTH COUNT LC$_1$ | | | <byte 0> | <byte 1> | <byte 2> | <byte 3> | <byte 4> |
| ENCODED LENGTH COUNT LC$_2$ | | | <byte 0> | <byte 1> | <byte 2> | <byte 3> | <byte 4> |
| OFFSET | | | | <byte 0> | <byte 1> | <byte 2> | <byte 3> |
| RAW DATA | | | | <byte 0> | <byte 1> | <byte 2> | <byte 3> |
| BS OUTPUT BUFFER | | | | | <byte 0> | <byte 0/1> | <byte 1/2> |
| CODE0 AND CODE1 | | | | | | | <byte 0/1> |

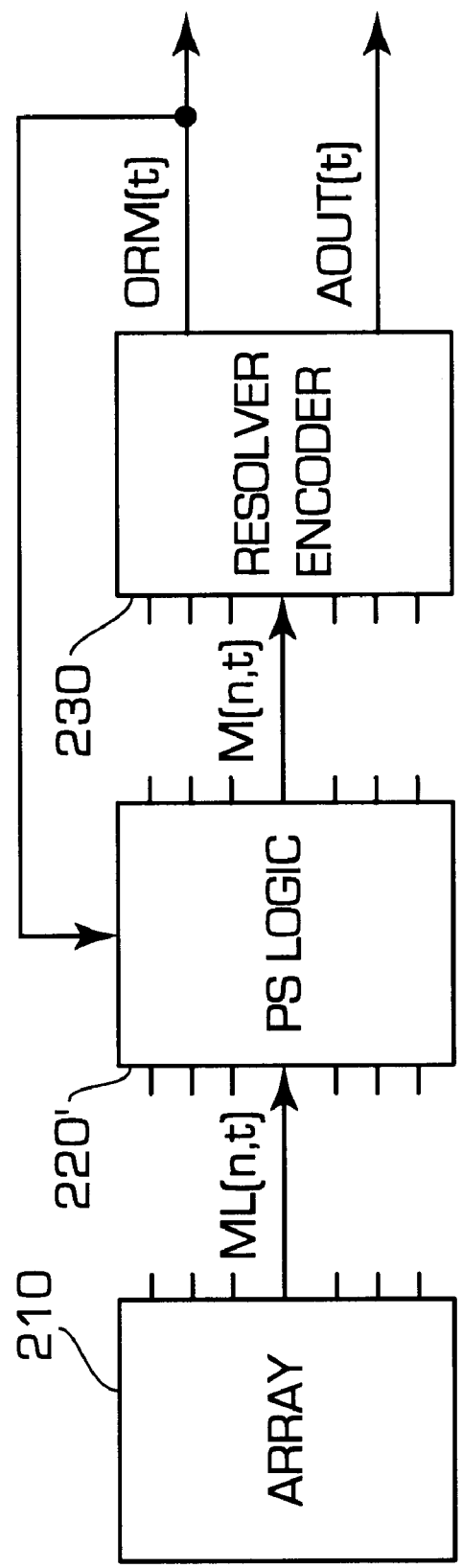

FIG. 7A

| | [t] | [t+1] | [t+2] | [t+3] | [t+4] | [t+5] | [t+6] |
|---|---|---|---|---|---|---|---|
| DATA0 | <byte 0> | | <byte 2> | | <byte 4> | | <byte 6> |
| DATA1 | <byte 1> | | <byte 3> | | <byte 5> | | <byte 7> |
| CAM BUFFER | | <byte 0> | <byte 1> | <byte 2> | <byte 3> | <byte 4> | <byte 5> |
| MATCH LATCHES | | | <byte 0> | <byte 1> | <byte 2> | <byte 3> | <byte 4> |
| CAM PRIORITY LATCHES | | | | <byte 0> | <byte 1> | <byte 2> | <byte 3> |
| ARRAY PRIORITY LATCHES | | | | | <byte 0> | <byte 1> | <byte 2> |
| BINARY LENGTH COUNT LC$_1$ | | | | | <byte 0> | <byte 1> | <byte 2> |
| ENCODED LENGTH COUNT LC$_2$ | | | | | <byte 0> | <byte 1> | <byte 2> |
| OFFSET | | | | | | <byte 0> | <byte 1> |

FIG. 7B

| | [t+3] | [t+4] | [t+5] | [t+6] | [t+7] | [t+8] |
|---|---|---|---|---|---|---|
| DATA0 | | <byte 4> | | <byte 6> | | <byte 8> |
| DATA1 | | <byte 5> | | <byte 7> | | <byte 9> |
| CAM BUFFER | <byte 2> | <byte 3> | <byte 4> | <byte 5> | <byte 6> | <byte 7> |
| MATCH LATCHES | <byte 1> | <byte 2> | <byte 3> | <byte 4> | <byte 5> | <byte 6> |
| CAM PRIORITY LATCHES | <byte 0> | <byte 1> | <byte 2> | <byte 3> | <byte 4> | <byte 5> |
| ARRAY PRIORITY LATCHES | | <byte 0> | <byte 1> | <byte 2> | <byte 3> | <byte 4> |
| BINARY LENGTH COUNT $LC_1$ | | <byte 0> | <byte 1> | <byte 2> | <byte 3> | <byte 4> |
| ENCODED LENGTH COUNT $LC_2$ | | <byte 0> | <byte 1> | <byte 2> | <byte 3> | <byte 4> |
| OFFSET | | | <byte 0> | <byte 1> | <byte 2> | <byte 3> |
| RAW DATA | | | <byte 0> | <byte 1> | <byte 2> | <byte 3> |
| BS OUTPUT BUFFER | | | | <byte 0> | <byte 0/1> | <byte 1/2> |
| CODE0 AND CODE1 | | | | | | <byte 0/1> |

APPARATUS FOR COMPRESSING DATA USING A LEMPEL-ZIV-TYPE ALGORITHM

This is a continuation of application Ser. No. 8/408,577 filed Mar. 22, 1995, now U.S. Pat. No. 5,771,010.

BACKGROUND OF THE INVENTION

1. Field of the Invention

The present invention is directed to an apparatus for compressing data in accordance with a Lempel-Ziv-type algorithm and, in particular, a hardware implementation of a compression engine for the algorithm.

2. Description of the Background Art

The basic Lempel-Ziv (L-Z) algorithm, which is described in "Compression of Individual Sequences via variable Rate Coding" by Lempel and Ziv in IEEE Transactions on Information Theory, September, 1978, pages 530–536, has served as a basis for effective data compression and, recently, has gained in popularity as a basis for high speed data transmission. The architectures that utilize the L-Z algorithm can have a variety of configurations, but typically have in common the communication between one computer system and other computer systems or I/O devices via an I/O channel. Each of the I/O channels will have a compression and decompression macro that operates with optional memory in implementing the L-Z algorithm.

In brief, the compression engine is designed to receive a stream of data bytes, store them in a "history memory" and compare each new byte to the stored bytes in order to detect repeated patterns of bytes so that the pattern of repetition can be used as a basis for reducing the amount of data that needs to be transmitted. If new data to be thus processed includes a "string" or sequence of two or more data bytes that have been processed before, then a token comprising a value length and a relative address of the previously processed data string will be generated. Since the new data which includes such string of previously processed data bytes can be expressed using fewer bits of information than that contained in the data string itself, the data stream is effectively compressed. If the new data to be processed does not form part of a previous data string existing in memory, there can be no compression and the raw data must be transmitted as a "raw token".

The decompression engine would be constructed with a similar "history memory" and corresponding decoding logic in order to effectively recover the original data byte stream by decoding the transmitted compressed word tokens and raw tokens.

One previous implementation of the Lempel-Ziv algorithm is commonly referred to as an "LZ1" type algorithm. When using the LZ1 algorithm, a start address and length of the matching string can be calculated, encoded and generated as a token. For example, a raw token is generated as a "0" followed by the raw byte. A compressed word token is passed as a "1" followed by a binary identification of the length of the matching string and a series of bits identifying the starting location of matching string in a memory array (called the displacement). A "control token" may also be generated which starts with either 1's and is followed with four bits designating the control instructions. Finally, an "end token", comprising only 1's in a series, may designate the end of a compressed data stream.

Table 1 shows the codes used to designate the length of a compressed data word string. This type of coding is a modified logarithmic coding wherein shorter strings utilize shorter codes and longer strings utilize longer codes. This is a useful coding technique when the frequency of shorter strings is substantially greater than the frequency of longer strings. The displacement is specified with an 11 bit value in an embodiment where the memory array has a 2K size. A shorter displacement may be used with a memory array having fewer sections and a smaller size, e.g., 1K or 512 size. In the following table, it should be noted that there are five groups of possible code lengths, each group comprising 2, 4, 6, 8 or 12 bits.

TABLE 1

Codes Used to Designate Compressed Word Length

| Code Field | Compressed Word Length |
|---|---|
| 00 | 2 words |
| 01 | 3 words |
| 10 00 | 4 words |
| 10 01 | 5 words |
| 10 | 6 words |
| 10 11 | 7 words |
| 110 000 | 8 words |
| ... ... | ... ... |
| ... ... | ... ... |
| 110 111 | 15 words |
| 1110 0000 | 16 words |
| ... ... | ... ... |
| .... .... | ... ... |
| 1110 1111 | 31 words |
| 1111 0000 | 32 words |
| .... .... .... | ... ... |
| .... .... .... | ... ... |
| 1111 1110 1111 | 271 words |

An overview of how the above compression algorithm works can be provided by a simple example involving the compression of the phrase: "the boy the dog". As already explained, the above LZ1 algorithm compresses data by looking for repeated sequences of characters in the data stream. For example in the phrase "the boy the dog" the word "the" repeats itself in the sentence and therefore can be compressed. The compression would be accomplished by using the following series of steps:

First, the phrase is stored in a Content Addressable Memory (CAM) which can store one 8-bit ASCII character per address and commonly is called a "history buffer", which may be size but in a typical embodiment may have a 2K, 1K, or 512 bytes.

| Address | data | |
|---|---|---|
| 00 | t | |
| 01 | h | |
| 02 | e | |
| 03 | | |
| 04 | b | |
| 05 | o | |
| 06 | y | |
| 07 | | |
| 08 | t<==== | |
| 09 | h<==== | repeated string of characters |
| 10 | e<==== | |
| 11 | <==== | |
| 12 | d | |
| 13 | o | |
| 14 | g | |

Second, the repeated string of characters is identified, as shown above.

Third, the starting address of the first instance of the repeated string, called the "displacement" (here displacement=00), is recorded.

Fourth, the "length" of the repeated data string (here the data length=04) also is recorded.

Fifth, the non-repeated characters (i.e. "raw" data) are out as is, but only displacement and data length is output for the entire repeated character string. In the present example, the output for this compressed sentence would be:

| | data |
|---|---|
| Byte1 | t |
| 2 | h |
| 3 | e |
| 4 | |
| 5 | b |
| 6 | o |
| 7 | y |
| 8 | |
| 9 | length = 04, displacement = 00 |
| 10 | d |
| 11 | o |
| 12 | g |

In the preceding example, it is assumed that one can output the "d" (displacement) and "L" (data length) value in one single byte, which is not very practical. Also there would be a problem because a "marker" is needed to tell the depression algorithm whether a byte of data is "raw" (uncompressed) or compressed. Without a marker the "L" and "d" value will look like any other ASCII code and the decompression algorithm will not be able to function.

In order to avoid these problems, the LZ1 compressed data is coded according to a scheme outlined above and also the industry standard published by Quarter-inch Cartridge Drive Standards, Inc. in their QIC Development Standard entitled "Adaptive Lossless Data Compression (ADLC)"; WIC-154 Rev. A, (Mar. 10, 1994). A simplified description of the code is given below with reference to FIGS. 1A–1C.

FIG. 1A shows the six cases of data that can occur in the above described encoding scheme. Case 1 is for "raw" (uncompressed) data, and cases 2 through 6 are for different lengths of compressed data. By using different size compressed word tokens for compressed data, the length of the compressed data is reduced, thus increasing the compression effect. In this regard, the "code length" is the number of bits in a token (e.g. 9-bits for a raw token) while the "data length" is the number of bytes that the compressed code token will produce after it is decompressed (e.g. the length of the compressed code token for "the" in "the boy and dog" is 4).

In the LZ1 algorithm data arrangement, the first bit is a "coded bit". For example, as illustrated in FIG. 1A, the first bit of the code token is a "0" only if the code word has a raw byte. This bit is added to the existing 8-bits of the raw word (shown as b's in FIG. 1A) to make one 9-bit raw token. This first bit tells that the 8 bits following are raw data. Where there is a compressed word token, the "coded bit" is a "1", which means that the following data is compressed.

The rest of the coded data in FIG. 1A are compressed word tokens of differing lengths. Where there is a "1" as the coded bit, the next bits prior to the appearance of a "0" will indicate how many length bits ("L") will follow ("0" alone indicates one "L" bit, "0" proceeded by two "1"'s indicate three "L" bits, etc). The value of "L" is 0 or 1 depending on the length. The value of "d" contains the displacement address. In the data shown in FIG. 1A, eleven "d" bits are shown. These 11 "d"s are the displacement addresses in a 2K RAM acting as a history buffer. For a 1K or 512 byte history RAM, 10 or 9 "d" bits are used, respectively.

From FIG. 1A it is apparent that by looking at the first five bits of a token, it can be determined whether the code word is case 1–6. This, combined with knowing the history RAM size (2K, 1K or 512) allows the code length to be decoded. Table 2 below summarizes how to decode code length based on the preferred history RAM sizes, because it lists the code length for 2K, 1K, and 512 history RAM sizes.

TABLE 2

Code lengths based on decoding first 5 bits of code word

| CASE | FIVEBITS | SIZE2K | SIZE1K | SIZE512 |
|---|---|---|---|---|
| 1 | 0**** | 9 bits | 9 bits | 9 bits |
| 2 | 10*** | 14 | 13 | 12 |
| 3 | 110** | 16 | 15 | 14 |
| 4 | 1110* | 18 | 17 | 16 |
| 5 | 11110 | 20 | 19 | 18 |
| 6 | 11111 | 24 | 23 | 22 |

There are two additional LZ1 code types not shown in FIG. 1A. As previously noted, these two codes are called "end token" and "control token", both being special case 6 codes.

Using FIG. 1A as a guide, the actual compressed data expected out of the above LZ1 algorithm for the phrase "the boy the dog" is seen in FIG. 1B. Note that for convenience and clarity the actual ASCII codes for each character are not shown. Instead, either "b's" have been listed to represent the real ASCII value. In the example of FIG. 1B, the total number of bits in the compressed data is 115. Divided by 8 this yields 14.375 bytes, so compression is very slight when compared to the 15 bytes needed to store "the boy the dog" in uncompressed form. However, under actual operating conditions, the compression ratio can be much higher, on the order of two to three times.

An example of an earlier compression engine that performs the encoding of data strings as a combination of raw data and tokens comprising a length and memory address is illustrated in FIGS. 2A–2C. FIG. 2A is a block diagram showing the three main sections of the disclosed CAM macro 200. The first section 210 is the array of 512 byte storage elements that form the history buffer and contain the sequence of data input bytes (DI). Within the section, the previously received and stored bytes are compared to each new byte (received during an operational cycle at a time "t") and the matches are detected latched and identified within the same operational cycle (t) as match signals ML(t) on 512 "match latch" lines. Again, during the same operational cycle (t), those lines are input to a second section, Presence of String (PS) Logic 220, which is the string matching logic for identifying the presence of a string of two or more bytes by generating a match signal M(t) on corresponding output lines. The third section 230 is the encoder that receives the match signals (1="set" and 0="not set") for each location n at a common cycle time t and outputs an address AOUT (t). As seen in FIG. 2D, a 512 OR Gate generates. A bit (ORM) which indicates if there is a "string" in the history buffer. The address AOUT has a length of 9 bits ($\log_2 512$) and indicates the last byte in the string.

In operation, the array 210 accepts one byte of data (DI) each cycle (t) and outputs 512 ML (match latch) signals each cycle. For each cycle, DI is simultaneously written to the array at one of 512 locations and compared to the contents of the remaining 511 locations. The DI bytes are written in order so that successive bytes are logically adjacent in the history buffer. If DI matches the nth storage location at cycle t, then ML[n,t] will be "set", i.e., placed in a "1" state.

The PS logic 220 accepts 512 ML signals as inputs and outputs 512 M (match) signals and 512 PS signals. If there are currently no matching strings found in the history buffer, and if two successive DI bytes match two successive storage locations (i.e., if ML[n−1, t−1] and ML[n,t] are set, then M[n,t] is set indicating a string match of at least two successive bytes ending at storage location n. The signal ORM is the logical OR of all M lines, thus the setting of at least one M line will result in ORM being set to indicate the existence of an active string. When there is an active matching string, all ML matches are ignored except those that propagate an already active string. This ensures that the longest matching string is found to maximize compression of the input stream.

Strings are propagated from one cycle to the next by PS bits. When there is no active matching string (ORM=0), PS[n,t] is set to the logic state of ML[n,t−1], the value t−1 being the result of a delay in the PS register of 1 time unit. If there is an active matching string (ORM=1), then all ML signals are ignored except those that continue a string. So if ORM(t) is 1, then PS[n,t] is M[n,t−1].

As previously noted, the output of the PS Logic 220 is received by Encoder 230 and the AOUT(t) and ORM signals are generated. The 512 PS(n,t) output signals are fed the encoder and the 512 M(n,t) signals are fed to a 512 input OR, whose output is fed back to the PS Logic 220 for processing the next input byte DI.

FIG. 2B is a lower level block diagram of a conventional data compression engine 300 for the LZ1 algorithm, and provides additional detail with respect to the compression macro operation. The operation of the various elements of the data compression engine are controlled by a control circuit 305 which is coupled to each of the elements described below. The control circuit is a logic circuit which operates as a state machine. Data enters the compression engine via input data bus 310, is first latched in input data buffer register 320. The data stored in the input data buffer 320 is then compared with all current entries in the Content Addressable Memory (CAM) array 330 which serves as a circular history buffer. In the CAM array, there is an ordered array of byte storage elements and the last element feeds back to the first element to provide a circular flow in the buffer. Each of the plurality of array sections (sections 330-0 to 330-N are shown in the figure) includes a register 331 and a comparator 332. Each CAM array register 331 stores a word of data and includes a single storage element, called an empty cell (EC) 335, for indicating whether a valid or current data word is stored in the corresponding CAM array section register. Each comparator 332 in each CAM array section generates a match or active signal when the data word stored in the corresponding CAM array section register 331 matches the data word previously stored in the input data buffer 320 (i.e., when signals ML[n−1,t−1] and ML[n,t] both indicate a match.

Coupled to the CAM array 330 is a CAM section addressing circuit 340 which provides a random access selection signal to one of the several write sections (0–N) of the CAM array. The output of circuit 340 will identify one section of the CAM array 330 to be used to store the data word currently held in the input data buffer 320. Operating sequentially, the address circuit 340 will next identify which CAM array section will store the next data word in the input data buffer.

Current entries in the CAM array 330 are designated as those CAM array sections that have empty cells (EC) set to 1 and are not addressed by the section addressing circuit 340. If the data in any of the current CAM entries matches the data word in the input data buffer 320, then the comparator 332 for that CAM array section will generate an active match latch signal on its corresponding one of the match latch lines 342. The match latch signals for each of the match latch lines 342 will be input to a corresponding circuit in the PS logic section 220.

The primary selector (PS) register block 350 forms part of the PS Logic 220 in FIG. 2A and has an equal number of cells (n) that are used to indicate those corresponding sections in the CAM array 330 where the matching operation has been successful so far. That is, the PS cells that receive and store a "1" (active) indicate which CAM array section (330-0 to 330-N) contains the last word of a matching string of data words. Multiple cells (350-0 to 350-N) in the PS register block 350 may be active because there could be a number of locations in the CAM array where the incoming string of data words has occurred before. If the incoming stream of data words has not occurred before, then each word is considered a raw data word. The sequence of these raw data words is continuously stored until a string of two consecutive data words is found that does match a string of two consecutive words in previously processed data. Upon receipt of the next raw data word, it is determined if the string is to be continued and if any other new strings exist.

Specifically, once a match has been detected and prior to loading another new data word into the input data buffer 320, the contents of the block of PS cells are input to the encoder block 230 in FIG. 2A and generate an address. Also, a length counter 390 is incremented by 1 to identify the current length of a matching string, if one exists. Then, the random access section addressing circuit 340 is also activated. This activation accomplishes two things. First, it changes the output of the section addressing circuit 340 so that the next incoming data word is written into another section of the CAM array. Secondly, it causes the string matching logic to propagate the content of the cells in the PS Logic 220 so they each correspond to the CAM array sections immediately subsequent to the previous matching CAM array sections.

In the operation of the PS Logic 230, all active PS cells 350-0 to 350-N in the PS register block 350 whose corresponding match latch lines 342 are active will be maintained active. All PS cells whose corresponding match latch lines are not active, are cleared. If any of the PS cell entries then remain active, indicating that the current data word in the input data buffer extends a previous matching string of data words, then a PS OR gate 360 coupled to each of the PS cells will be active, indicating that a string is being continued.

In this manner, a next data word can be processed to determine whether it may also continue the matching string of data words stored in the CAM array. This matching process continues until there is a "0" at the output of the PS OR gate 360, signifying that now there is no current match of a new word with a stored word. When this occurs, address generator 370, which forms a part of the encoder 230, then determines the location of one of the matching strings and generates its address on bus 380. The address generator 370 may be a logic circuit utilized to generate an address given a signal from one or more of the cells of the PS register block 350. Such a logic circuit may be easily designed by one of ordinary skill in the art. The length of the matching string is indicated by the count in the length counter 390.

The address generator 370 generates the fixed (also known as absolute) address of the CAM array section containing the end of the matching string and the length counter 390 provides the length of the matching string. Therefore, a start address and length of the matching string can be calculated, encoded and generated as a token.

FIG. 2C. is a block diagram illustrating a single section 400 of the CAM array in the compression engine. The section 400 which receives an input from cell address circuit 410 and control circuit 405, includes a CAM array register 431 and a comparator 432, the register 431 including an empty cell 433. Each of these elements is coupled to the control circuitry 305 described above in FIG. 2B, which provides reset, shift, write and load inputs to the array section 400. Data is transferred from the input data buffer 420 to the designated CAM array register 431 during a write operation, or to the comparator 432 whenever a comparison is performed. The value from the input data buffer 420 is compared by comparator 432 to the value in CAM array register 431. If the value in the input data buffer is equal to the value in the CAM array register, then comparator 432 will generate a match latch (ML) signal having a value of "1". Otherwise the comparator 432 will generate a match latch signal (ML) having a value of "0". The ML signal is stored in a latch register (L-type not shown) forming a part of the comparator at its output, and is provided to the PS Logic block 220 for further sequential processing.

In a typical embodiment, there are 2,048 sections 400 in the CAM array, thereby requiring the use of at least 11 bits to designate the address of a string within the CAM array. In such case, the CAM array may be 2,048 sections connected in parallel or it may be 4 sets of 512 sections coupled in parallel. In an alternative embodiment, the CAM array may be 1,012 sections deep, thereby requiring at least a 10 bit address description or 512 bits requiring at least a 9 bit address description or 512 bits requiring at last a 9 bit address. Alternative embodiments may allow the use of different size CAM arrays.

A conventional implementation of the PS Logic is illustrated in FIG. 2D, where each of the match latch (ML) outputs at a given processing cycle time (t) are provided to a corresponding PS Logic section 500 at a location (n) having an AND gate 510. Also input to the AND gate is the Primary Select (PS) output from an adjacent PS Logic section at location (n−1) during the same processing cycle (t). The AND gate 510 output is provided along with 511 other similar outputs as a fan-in (FI) to the OR 560, which outputs a signal ORM(t) indicating that at a time t there is or is not a string present. When implemented in hardware, the OR circuit 560 requires a substantial chip area, raising one of the problems that the invention is intended to solve.

The ORM(t) signal is applied to an AND/OR/Invert (AOI) 540, together with the inverted output of a first driver 520, having as its input the Primary Select signal PS(n−1, t) and the inverted output of a second driver 530, having as its input the match latch signal ML(n,t). The output of the AOI 540 is provided to the PS register 550. The register 550 generates an output, for location n and at time t, which is provided to an encoder 600. That output also is made available to a subsequent PS Logic stage. The implementation of the PS Logic 220 using a plurality of such stages 500 will involve substantial element and chip area requirements, particularly for the AOI 540 and the drivers 520 and 530 in each stage.

As a result, the compression is performed quickly and efficiently. Using the LZ1 approach described above, there is an effective compression because the search for matching data strings is exhaustive. That is, the CAM array allows for an exhaustive search for all possible matching strings.

When the CAM macro is implemented in accordance with the structures of FIGS. 2A–2D, the efficient compression of an incoming data stream requires a pipeline compression data flow which provides coordinated parallel flow of data in order to achieve a high and accurate throughput.

FIG. 3 is a high level block diagram of the LZ1 compression macro 1000 which utilizes the CAM structure of FIGS. 2A–2D and FIGS. 4A and 4B are timing diagrams which show the timing of the data and control flow through the logic. In the illustrated arrangement of FIG. 3, the pipeline data flow is based on a completely double latched design. This allows the current state of a register to be used as either the next data to be loaded into the register, or as some part of the control for what is to be loaded next into the register. For example, the CAM match latches 1332, as well as other latches inside the CAM macro with the exception of the history buffer itself, are L1/L2 latch pairs which store the results of a compare between the input data byte and the existing valid contents of the CAM. Latches used outside the CAM, for example, latches 1210–1260, also may be of the L1/L2 type.

Referring to FIG. 3, the existence of two parallel paths of flow is apparent, both paths beginning from a common source, diverging into a left hand path that comprises the CAM macro 1300 and a right hand path that comprises a series of latches 1210–1260, and both paths converging in a barrel shifter logic 1600 and output buffer 1700 from which encoded data is output. In order to achieve continuity and synchronized processing in the system, the two paths must pass each data word in parallel using the same number of processing cycles (each having a cycle number "t") such that they arrive in synchronism at the barrel shifter logic. In particular, the (t) next to DATA0 and DATA1 and the (t+n) reference next to each other stage is to help visualize the time relationships between each stage of latches in the pipeline. For example, the (t+2) shown at the match latches 1332 simply means that Byte0 will be loaded into the match latches 1332 two 2 clock cycles after it has arrived at the DATA0 and DATA1 buffers. All structures in the compression macro that require one procession cycle and contribute a delay are indicated by a solid line. Those structures which do not result in a delay in the pipeline are indicated by a dotted line.

As seen in FIG. 3, data first enters the compression macro 1000 through a macro interface into buffers DATA0 1110 and DATA1 1120. The data bytes come into the compression macro at a first clock (t) and are selected one at a time by the select logic block 1130. The select logic block 1130 will alternately choose a data byte stored in DATA0 or DATA1 to be shifted from one of the two registers and then into the history buffer 1330 inside the CAM during a first clock cycle (t+1). The timing of the CAM requires that in most cases a gate array (not shown) provides signals and data directly from the output of the L2 latch in each section of the history buffer.

The Primary Shift register 1350 will assume a binary state of 1 or 0, the 1 typically representing either a match which represent a new string starting or the next byte in line of a current string under compression. The priority encode logic 1360 will run every clock cycle (here at cycle t+4) and will result in an encoded address inside the CAM. Where the CAM is 512 bytes wide, a 9 bit address will be generated which will need to be resolved down to one address within the cycle time t+4.

The address block 1380 contains the final priority encoding stage, which is implemented in gate array logic and requires an additional cycle (t+5). The output of this function is latched to allow a maximum propagation delay time for the next stage which is the 11 bit adder 1400. If a string of bytes is continuing to match, or if the previous comparisons ended with just one matched byte, then the encoded address that was created will not be used.

Each time the PS register 1350 is loaded with a continuation of a current string of compression, two versions of a length count are created by length counter 1390. One version LC-1 is a binary count used for the 11 bit adder 1400, and the other version LC-2 is an encoded form for use as an output of the compression macro 1000. The early availability of the length count LC-2 to the barrel shifter logic 1600 allows a simple, small and fast barrel shifter implementation.

The 11 bit adder 1400 receives the count LC-1 in binary form from the length counter 1390 and adds that value to the value of the address output from the final stage of the address generator 1380. The 11-bit adder output will be used to generate an offset during a further cycle t+6.

The function of the barrel shifter 1600 is to smooth out the output data rate in order to meet the minimum instantaneous data rate out of the compressor. The barrel shifter 1600 will take data from either the length counter 1390 as LC-2 and from the offset 1500, or as a raw byte from latch 1260. Since at least two bytes of raw data will be compressed for each compression string, it is clear that the barrel shifter will never be in a situation where it will need to shift raw data or a previous offset value during the time it needs to fetch a new valid encoded length count.

In a preferred embodiment, the barrel shifter logic 1600 is supplied to a 28 bit output buffer 1700. The output buffer 1700 is packed from left to right, during a clock cycle t+7. When 16 or more bits reside in the output buffer 1700, 16 bits will be sent out of the compression macro interface 1800 as CODE0 and CODE1 bytes, during a final clock cycle t+8. At the same time the output buffer will shift all the remaining contents 16 bits and load in the next compressed or raw data if they are available.

As previously noted, the key to creating accurate processing using pipeline data flow is to make sure all the information is available at each stage so that the basic decisions needed for the next immediate action on the currently processing data can be made. The three basic decisions that need made in the PS Logic at the Primary Shift register stage are:

(1) Is there no match?
(2) Is there a continuation of the current matching string? and
(3) Is there a match representing a new string?

As a result of those decisions, there are only two actions which need to take place. A first action is to load the current contents of match latches 1331 into the primary shift register 1350. The second action is to load the current contents of the primary shift register 1350 back into the primary shift register 1350 shifted by 1 bit and only if the new location also had a bit set in the match latches 1331. The information needed to make the decision of how to load the primary shift register 1350 can be generated from the current contents of the primary shift register 1350 and the outputs of the match latches 1331.

The timing for the data flowing through the pipeline arrangement of the compression macro is shown in FIGS. 4A and 4B. There the location of bytes 0 to 9 can be seen for time periods (t) to (t+9), in accordance with the explanation given previously for the arrangement of FIG. 3.

While the above referenced is one design for implementing the LZ1 algorithm, there are a variety of system architectures that can implement the Lempel-Ziv coding technique.

One such implementation is seen in U.S. Pat. No. 5,329,405. However, in that implementation, the manner in which new strings are implemented is deficient. In particular, the disclosed method requires an INIT signal to set the dynamic transfer gates. This requires cycles during which the throughput of the macro is suspended. Accordingly, a throughput of one byte per cycle cannot be sustained.

Other implementations of the compression feature of the Lempel-Ziv algorithm are seen in the following patents:

U.S. Pat. No. 5,150,430 which concerns the use of the Lempel-Ziv algorithm for compressing data using parallel shift register-based compression units, and a decoder which compares tally values with stored length values.

U.S. Pat. No. 5,153,591 which concerns data compression and decompression utilizing a simplified Lempel-Ziv algorithm having a tree structure for a compression dictionary;

U.S. Pat. No. 5,179,378 which concerns data compression and decompression using Lempel-Ziv techniques and employing systolic arrays of parallel processors, where the code words are of fixed length and indicate the length and starting point of the code.

U.S. Pat. No. 5,226,119 which concerns the use of a barrel shift circuit in connection with a graphic display controller.

U.S. Pat. No. 5,243,341 which concerns a Lempel-Ziv compression scheme with enhanced adaptation, and employing two dictionaries, the second being used as a standby when the first is being reset.

U.S. Pat. No. 5,247,638 which concerns an apparatus for compressing data in a dynamically mapped virtual data storage system.

U.S. Pat. No. 5,262,776 which concerns a Lempel-Ziv algorithm for data compression of partial sequences of a data sequence, and in particular, a technique to generate a primary sequence from coefficients of a discrete cosine transform of image values of picture elements of a reproduced image.

SUMMARY OF THE INVENTION

An object of the present invention is to provide high speed data compression for information according to a Lempel-Ziv-type compression algorithm.

It is another object of the present invention to provide a hardware implementation of a high speed data compression system using a Lempel-Ziv-type algorithm which encodes data using code length and address information, where the chip area required for such implementation is reduced.

It is yet another object of the present invention to provide a method and apparatus for implementing a high speed compression of information encoded by a Lempel-Ziv-type algorithm wherein the logic eliminates at least a redundant n-way Or function, thereby utilizing less real estate and saving manufacturing costs.

It is yet another object of the present invention to provide a method and apparatus for reducing the latency in the pipeline processing of transmitted data which implements a high speed compression of information encoded by a Lempl-Ziv-type algorithm.

It is still a further object of the present invention to provide a method and apparatus for permitting the initiation of a data string without interruption of the processing cycles in the compression macro.

BRIEF DESCRIPTION OF THE DRAWINGS

FIG. 1A is an example of the Lempel-Ziv code data for a 2K RAM, FIG. 1B is an example of coding each letter of a text sequence and FIG. 1C is an example of the coded sequence as stored.

FIGS. 2B and 2C provide details of the CAM array in the conventional compression macro: and FIG. 2D illustrates details of the conventional PS Logic sections used in a compression macro.

FIGS. 4A and 4B are illustrations of the timing of data flow through the compression macro pipeline arrangement.

FIG. 5A is a high level block diagram of the improved compression macro and FIG. 5B is a block diagram of the PS Logic hardware design in accordance with the present invention.

FIGS. 7A and 7B are timing of data flowing through the compression macro pipeline arrangement in accordance with the present invention.

DESCRIPTION OF PREFERRED EMBODIMENTS

Figure 2A:
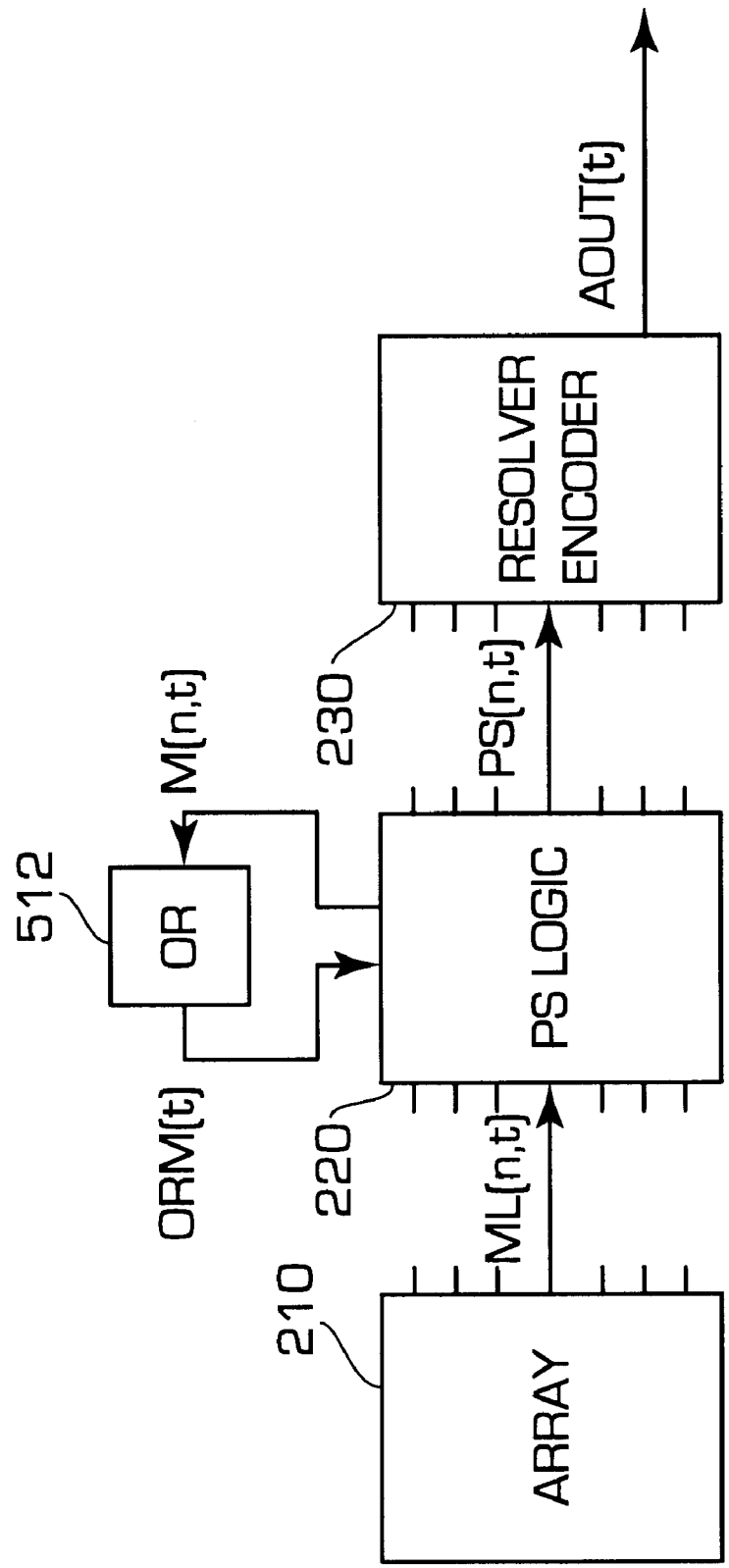
FIG. 2A is a high level block diagram of the conventional compression macro.

As previously noted with respect to FIG. 2A, in a compression operation one byte of input data (DI) is processed each cycle (t) and 512 ML signals are output from the array section 210 each cycle. If DI matches the nth storage location at cycle t, then ML[n,t] will be "set", i.e., placed in a "1" state, otherwise it will be placed in a "0" state. If two successive DI bytes match two successive storage locations (i.e., if ML[n−1, t−1] and ML[n,t] are set, then M[n,t] is set indicating a string match of at least two successive bytes ending at storage location n.

It continues to be necessary to have the signal ORM generated as the logical OR of all M lines, so that the setting of at least one M line will result in ORM being set to indicate the existence of an active string. It also continues to be necessary to have strings propagated from one cycle to the next by PS bits. Thus, when there is no active matching string (ORM=0), PS[n,t] is set to the logic state of ML[n, t−1], the value t−1 being the result of a delay in the PS resister of 1 cycle. If there is an active matching string (ORM=1), then all ML signals are ignored except those that continue a string. So if ORM(t) is 1, then PS[n,t] is M[n,t−1].

This relationship can be represented by the following equations:

$$PS[n, t] = \begin{cases} ML[n, t-1] & \text{, if } ORM[t-1] = 0 \\ M[n, t-1] & \text{, if } ORM[t-1] = 1 \end{cases} \quad (1)$$

where, $$ORM[t] = \sum_n M[n, t] \quad (2)$$

and, $$M[n, t] = ML[n, t] \cdot PS[n-1, t] \quad (3)$$

Equations 1, 2 and 3 form a set of coupled recursive equations. Variables on the right hand side are known and used to solve for the left hand side. Equation 3 can be rewritten as.

$$M[n, t] = ML[n, t] \cdot \begin{cases} ML[n-1, t-1] & \text{, if } ORM[t-1] = 0 \\ M[n-1, t-1] & \text{, if } ORM[t-1] = 1 \end{cases} \quad (4)$$

Figure 5B:
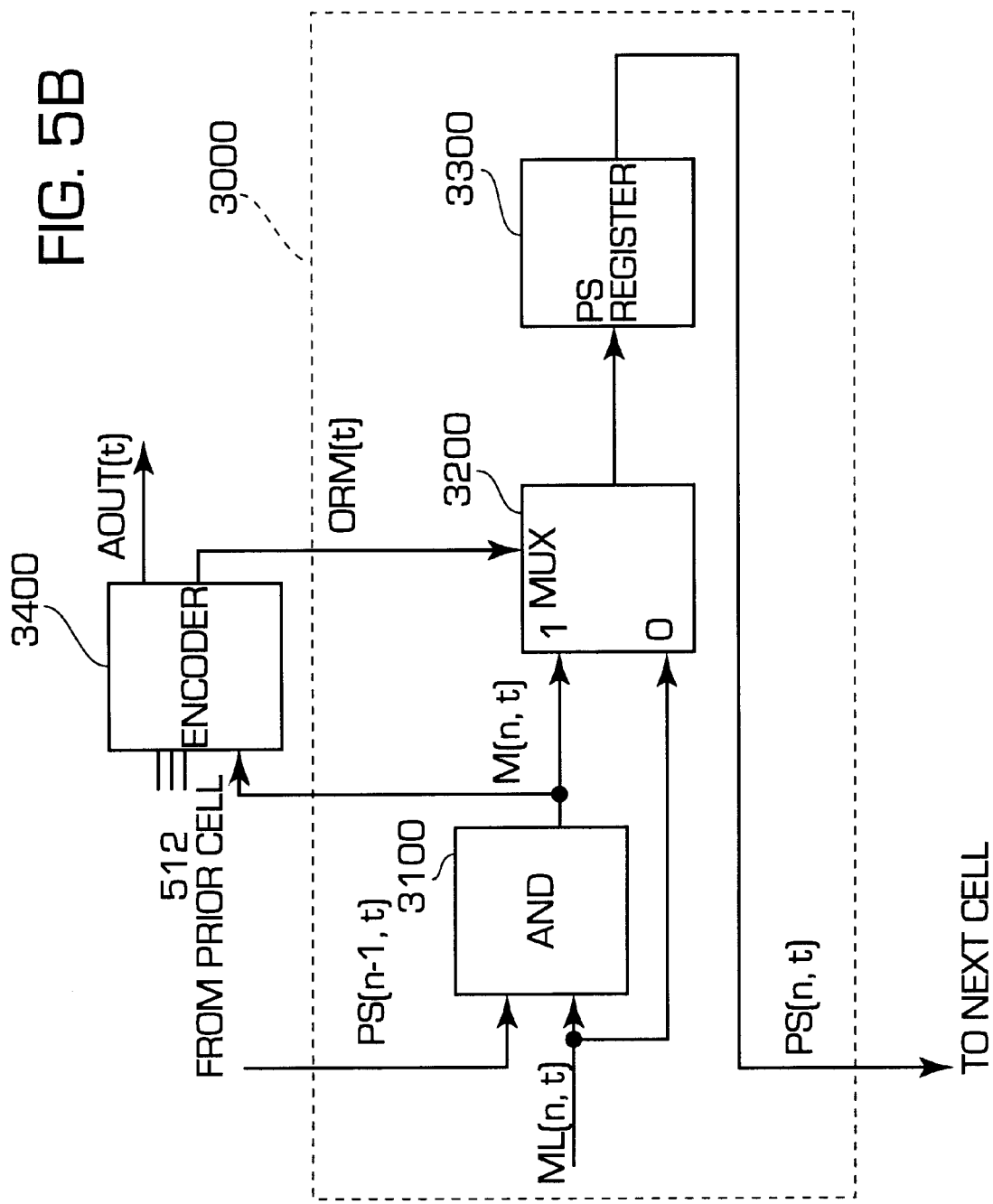

This set of equations may be implemented in a compression macro as seen in FIG. 5A, wherein the array 210 and encoder 230 are the same as seen in FIG. 2A. However, the PS Logic block 220' is different and is implemented in hardware as shown in FIG. 5B.

FIG. 5B is the logic schematic of one PS Logic block 3000, forming a part of the PS Logic section 220' as seen in the compression macro arrangement of FIG. 5A that implements the present invention. As previously discussed with respect to the conventional CAM array section 210, each byte storage location (n) in the CAM array section 210 will generate and store a match latch signal at time (t) having a value ML(t,n). In addition, an adjacent section (n−1) will generate a PS signal at the same time (t) having a value PS(n−1,t). These two signals are input to an AND gate 3100, whose output is a signal indicating that there is a string established due to the presence of a match at two logically adjacent locations. The AND gate 3100 outputs a match signal M(n,t) which is applied to the encoder 3400 in a common fan-in arrangement with 511 other inputs. A logical OR of the 0512 signals will be provided as an output of the encoder 3400 and fed back to each block 3000 in the PS Logic section 220' as signal ORM (t). The match signal M(n,t) also is input to a multiplexer 3200 at its "1" terminal. The second terminal is a "0" terminal which receives the input ML (n,t) signal. The ORM(t) signal serves to switch the multiplexer 3200 between the ML (n,t) and the M(n−1, t) signals. The output of the multiplexer is provided to a PS register 3300, whose output serves as a PS signal PS (n,t) for use in the next section of the PS Logic. While there is one common encoder circuit 3400, which may be identical to that used with the conventional approach seen in FIGS. 2A–2D, there is no 512 way OR function within the PS Logic. In other words, the OR gate 360 in FIG. 2D has been eliminated from the PS Logic section 220'.

In operation, particularly when compared to the conventional circuit in FIG. 2D, it can be seen that there are 512 fan-in input signals to the encoder 3400 and that the encoder outputs an address signal AOUT(t) representing the address of the string end. Each of the 512 inputs FI to the encoder comes from an AND gate 3100, which receives the matching logic signal ML at time (t) and position (n) as well as the PS signal for the same time cycle (t) but a prior position (n−1). In addition to serving as an input to the encoder 3400 at the "1" terminal, the AND gate output M[n,t] is input to a multiplexer 3200. A second input to the multiplexer at the "0" terminal is the matching logic signal ML[n,t] from a respective CAM array section (n). On the basis of the ORM(t) signal from the encoder 3400, which indicates that a string has been detected from the 512 inputs ML[n,t], the multiplexer 3200 acts to select the ML or M signals as an input to the PS Register 3300 in accordance with Equation (1). The PS register 3300 outputs a signal PS[n,t], indicating that for the same time period, the PS signal for a subsequent location has been developed.

Figure 3:
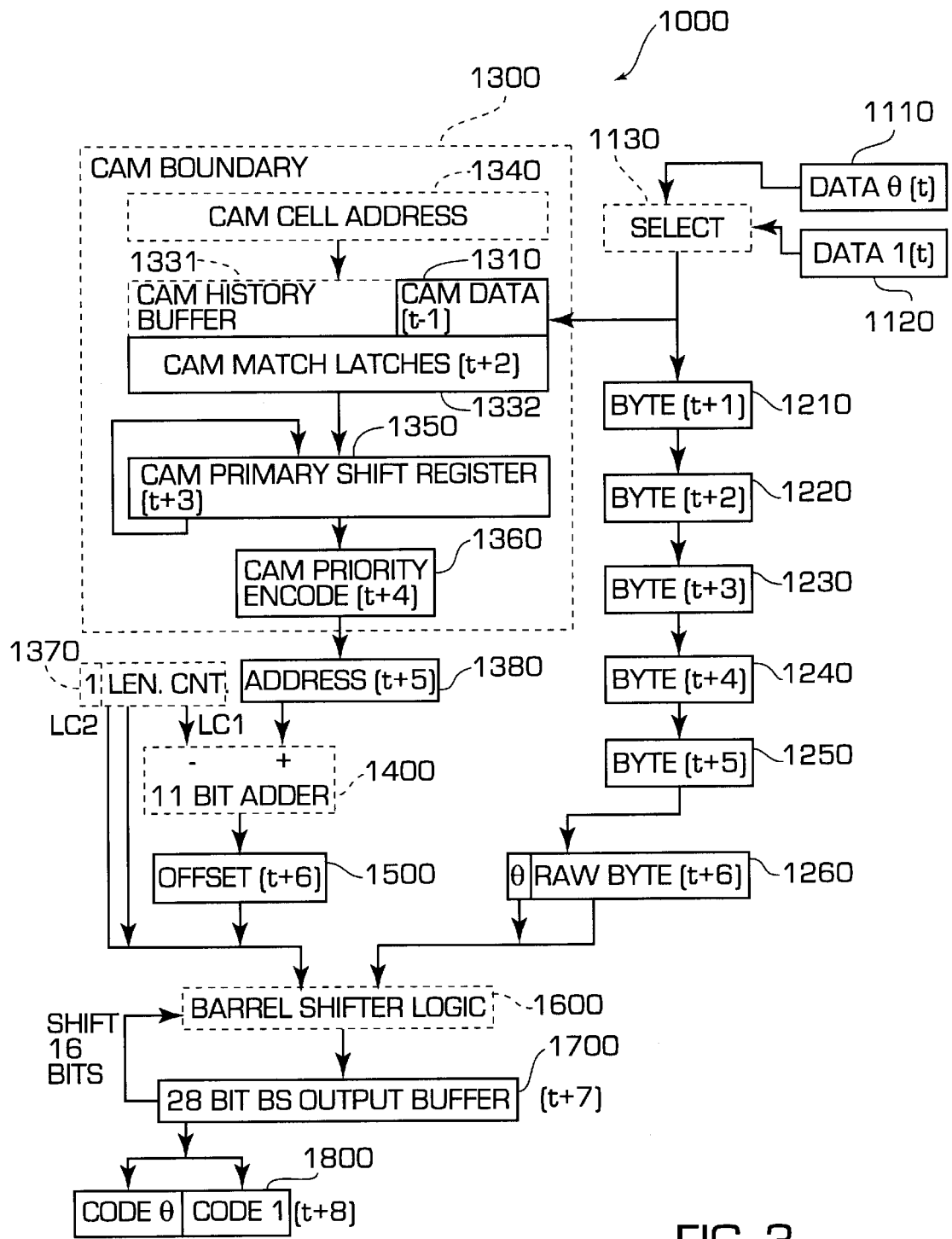
FIG. 3 is a flow diagram of a pipeline compression data flow in the conventional design.

It should be noted that the PS register is connected within the PS Logic so that it does not output directly to the encoder 3400 and is not directly in the path for the generation of the AOUT(t) signal, unlike the conventional design where the register is prior to the encoder and requires one cycle time in the compression pipeline. Placement of the PS register outside of the pipeline will reduce the transit time, as seen from the illustration in FIG. 6. In the Figure, a compression macro 4000 is illustrated and is substantially the same as the pipeline arrangement for the conventional design seen in FIG. 3. The only difference is in the CAM macro 4300, where the PS register no longer contributes a cycle delay to the pipeline path (as indicated by the use of a dotted line to defined the block), and in the cascaded group of registers. The elimination of the PS register delay from the pipeline processing in the CAM macro will reduce the latency time in the pipeline process. Accordingly, one latch in the parallel path between the selector 4130 and the raw byte register 4250 can be eliminated. An illustration of the data flow in the new pipeline arrangement is seen in FIGS. 7A and 7B. A comparison with corresponding FIGS. 4A and 4B will further illustrate the advantages of the present invention in a system application.

Figure 8:
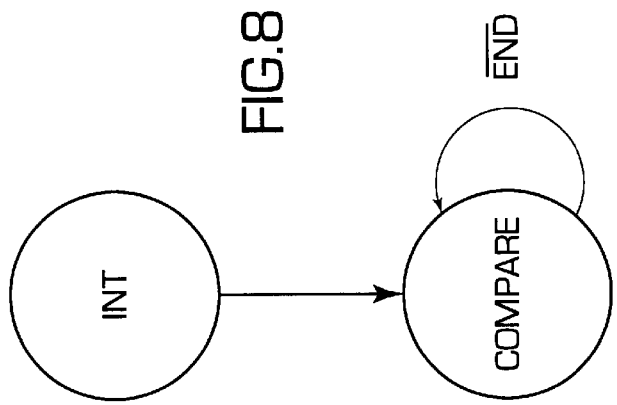
FIG. 8 is a state diagram of the present invention.
Figure 2C:
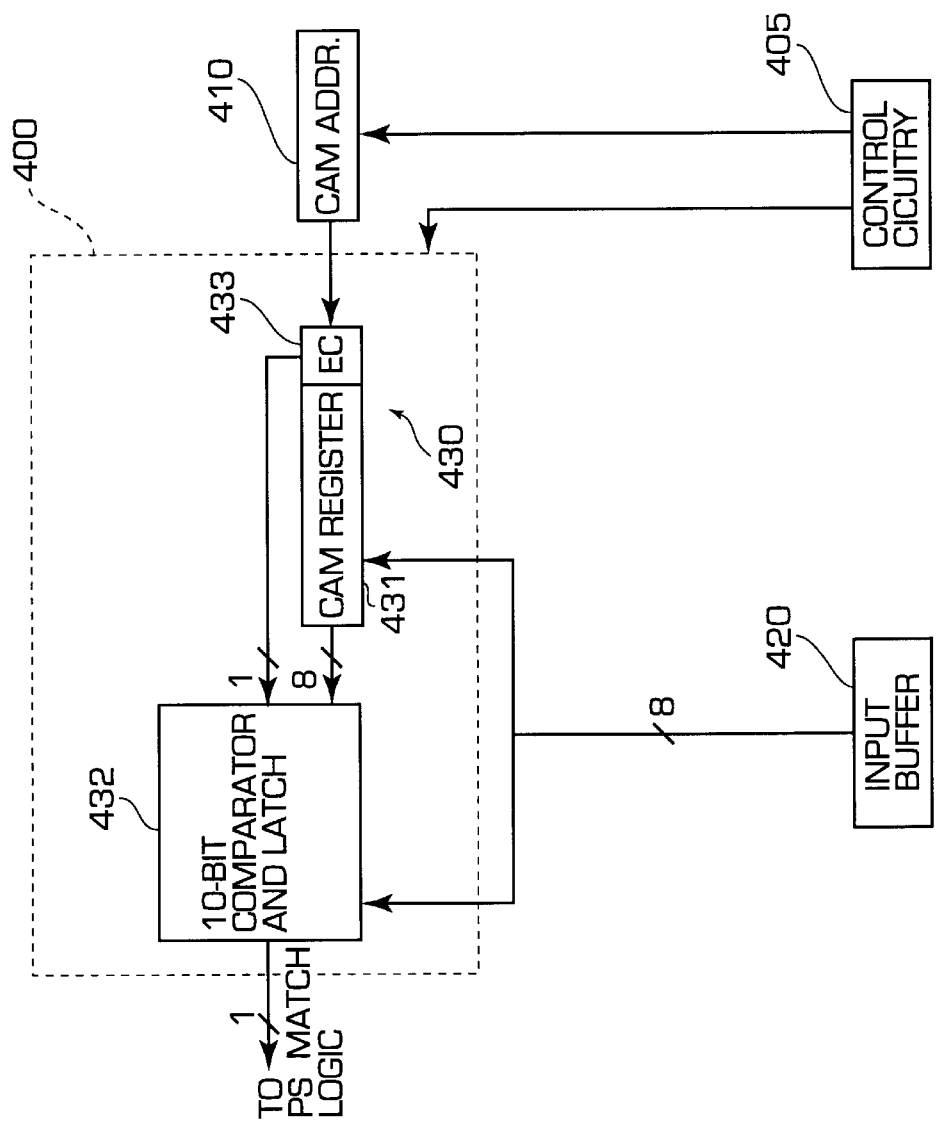
Figure 6:
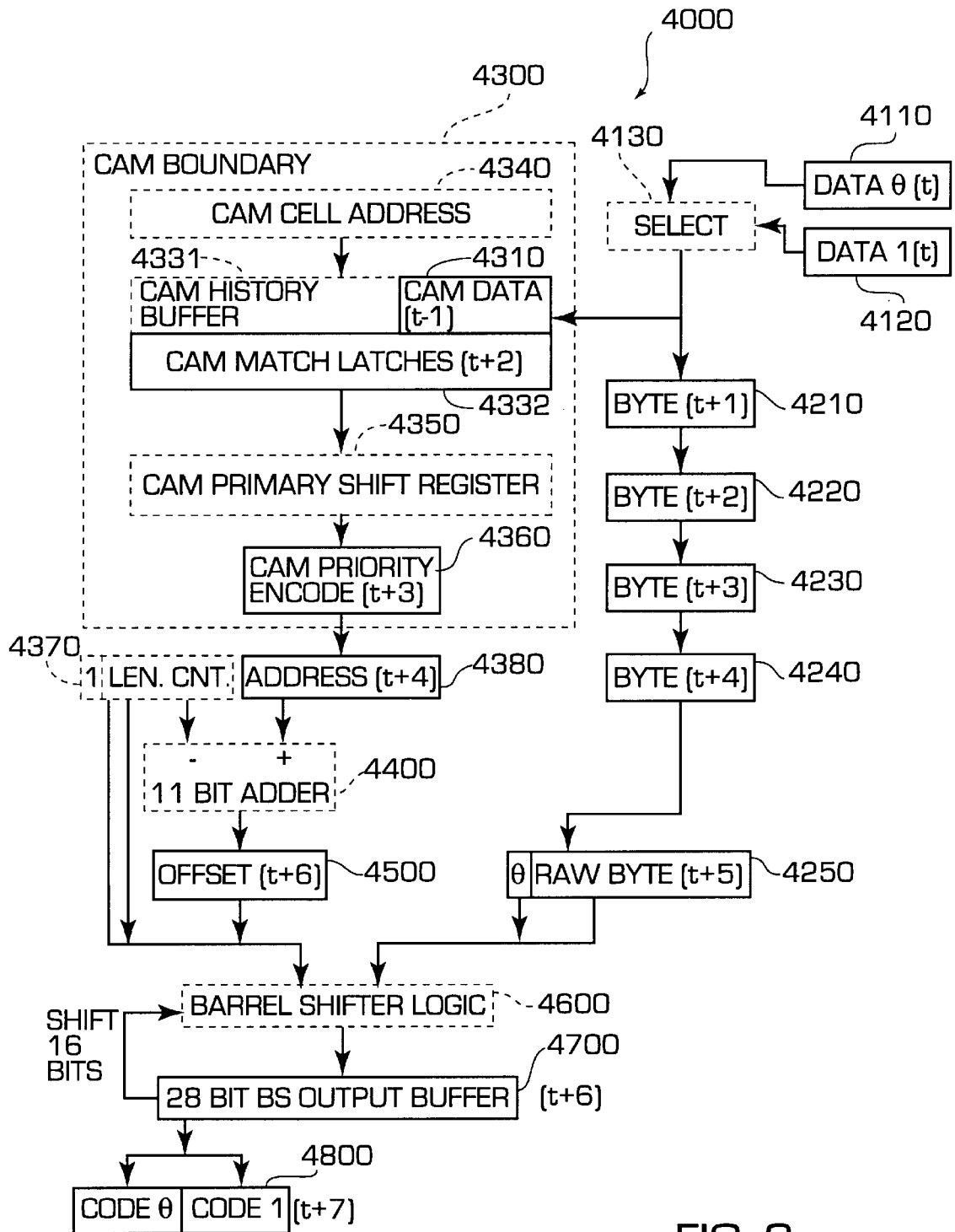
FIG. 6 is a flow diagram of a pipeline compression data flow in accordance with the present invention.

On the basis of the PS logic hardware implementation in FIG. 5A and 5B, and the pipeline flow as seen in FIG. 6, the state operation, as reflected in the state diagram seen in FIG. 8, can be achieved. The implementation is simple and efficient, requiring the transfer between only two states, initialization INT and COMPARE, and the execution of COMPARE a plurality of times before ending.

When the resultant ML, PS and M signals are arranged in an array on the basis of the location n and the time interval m, the required match detection can be viewed simply as a pattern recognition problem, as would be understood by one of ordinary skill in the art.

Although this invention has been described in at least one preferred embodiment with a certain degree of particularity, it is to be understood that the present disclosure of the preferred embodiment has been made only by way of example and that numerous changes in the details and arrangement of components may be made without departing from the spirit and scope of the invention as hereinafter claimed.

I claim:

1. A data compression apparatus for identifying repeated data element strings in a data stream having a plurality of data elements comprising:

a history buffer for concurrently storing a plurality of the data elements in separately addressable locations, each data element being stored at an addressable location;

an input means for inputting a current data element;

a plurality of comparison means, each for comparing said current data element with the content of a stored data element then stored in a corresponding addressable location in said history buffer, said plurality of comparison means being operative to generate an output identifying all existing matches between said current data element and all stored data elements;

a plurality of logic means, each for receiving the corresponding output of one of said comparison means and for generating a signal identifying the existence of a string of at least two data elements; and an encoder responsive to said signals from said plurality of logic means for generating a first output comprising an address identifying a repeated data element string and a second output indicating the existence of a repeated data element string within said history buffer.

2. The data compression apparatus as set forth in claim 1 wherein each of said logic means comprises a means responsive to said comparison means output and the output from another logic means for generating a match signal, a match signal from each said plurality of logic means being provided to said encoder.

3. The data compression apparatus as set forth in claim 2 wherein each said logic means further comprises a binary signal generator responsive to a match signal and said comparison means output for generating a string indicator signal.

4. The data compression apparatus as set forth in claim 3 wherein said logic means further comprises a register responsive to said binary signal generator for storing said string indicator signal for access by another logic means.

5. The data compression apparatus as set forth in claim 1 wherein said data compression apparatus is operative in accordance with a Lempel-Ziv type algorithm.

6. The data compression apparatus as set forth in claim 1 wherein said data compression apparatus is operative in accordance with an LZ1 standard algorithm.

7. The data compression apparatus as set forth in claim 1 wherein said history buffer stores current bytes in order so that successive bytes are physically adjacent in said history buffer.

8. The data compression apparatus as recited in claim 7 wherein said apparatus has a throughput of one byte per cycle, to compress a set of data.

9. The data compression apparatus as set forth in claim 1 wherein said apparatus is operational between only two states, a first for initialization and a second involving an execution of a comparison a plurality of times before ending.

10. The data compression apparatus as recited in claim 9 wherein said apparatus has a throughput of one byte per cycle, to compress a set of data.

11. The data compression apparatus as recited in claim 1 wherein said apparatus has a throughput of one byte per cycle, to compress a set of data.

* * * * *

UNITED STATES PATENT AND TRADEMARK OFFICE
CERTIFICATE OF CORRECTION

PATENT NO.: 5,903,230
DATED: May 11, 1999
INVENTOR(S): Charles J. MASENAS

It is certified that error(s) appears in the above-identified patent and that said Letters Patent is hereby corrected as shown below:

Column 7, line 34 delete "last" insert --least--.

Column 10, line 58 delete "Lempl" insert --Lempel--.

Column 12, line 38 delete "360" insert --560--.

Signed and Sealed this

Tenth Day of April, 2001

*Attest:*

NICHOLAS P. GODICI

*Attesting Officer*    *Acting Director of the United States Patent and Trademark Office*